United States Patent
Tham et al.

(10) Patent No.: US 10,971,181 B2
(45) Date of Patent: Apr. 6, 2021

(54) SPUTTERING TARGET FOR MAGNETIC RECORDING MEDIA

(71) Applicants: TANAKA KIKINZOKU KOGYO K.K., Tokyo (JP); TOHOKU UNIVERSITY, Sendai (JP)

(72) Inventors: Kim Kong Tham, Tsukuba (JP); Ryousuke Kushibiki, Tsukuba (JP); Toshiya Yamamoto, Tsukuba (JP); Shin Saito, Sendai (JP); Shintaro Hinata, Sendai (JP)

(73) Assignees: TANAKA KIKINZOKU KOGYO K.K., Tokyo (JP); TOHOKU UNIVERSITY, Sendai (JP)

( * ) Notice: Subject to any disclaimer, the term of this patent is extended or adjusted under 35 U.S.C. 154(b) by 57 days.

(21) Appl. No.: 16/346,073

(22) PCT Filed: Oct. 11, 2017

(86) PCT No.: PCT/JP2017/036824
§ 371 (c)(1),
(2) Date: Apr. 29, 2019

(87) PCT Pub. No.: WO2018/083951
PCT Pub. Date: May 11, 2018

(65) Prior Publication Data
US 2020/0105297 A1 Apr. 2, 2020

(30) Foreign Application Priority Data
Nov. 1, 2016 (JP) .............................. JP2016-214684

(51) Int. Cl.
*H01J 37/34* (2006.01)
*G11B 5/65* (2006.01)
(Continued)

(52) U.S. Cl.
CPC ................ *G11B 5/656* (2013.01); *C22C 5/04* (2013.01); *C22C 19/07* (2013.01); *C23C 14/08* (2013.01);
(Continued)

(58) Field of Classification Search
CPC ..... C22C 19/07; C22C 32/00; C23C 14/0688; C23C 14/08; C23C 14/34; C23C 14/3414;
(Continued)

(56) References Cited

U.S. PATENT DOCUMENTS

2006/0289294 A1 12/2006 Racine et al.
2009/0308740 A1* 12/2009 Kato .................. C23C 14/3414
204/298.13
(Continued)

FOREIGN PATENT DOCUMENTS

JP 2007-004957 A 1/2007
JP 2015-032336 A 2/2015
(Continued)

OTHER PUBLICATIONS

Oikawa et al., "Microstructure and Magnetic Properties of CoPtCr—SiO2 Perpendicular Recording Media," IEEE Transactions on Magnetics, Sep. 2002, vol. 38, No. 5, pp. 1976-1978.
(Continued)

*Primary Examiner* — Rodney G McDonald
(74) *Attorney, Agent, or Firm* — Oliff PLC (57) ABSTRACT

A sputtering target for magnetic recording media capable of producing a magnetic thin film in which the magnetic crystal grains are micronized and the distance between the centers of the grains is reduced while good magnetic properties are maintained. The target including metallic Pt and an oxide, with the balance being metallic Co and inevitable impurities, wherein the Co is contained in a range of 70 at % to 90 at % and the Pt is contained in a range of 10 at % to 30 at %
(Continued)

relative to a total of metallic components in the sputtering target for magnetic recording media, the oxide is contained in a range of 26 vol % to 40 vol % relative to a total volume of the sputtering target for magnetic recording media, and the oxide is composed of $B_2O_3$ and one or more high-melting-point oxides having a melting point of 1470° C. or higher and 2800° C. or lower.

20 Claims, 6 Drawing Sheets

(51) Int. Cl.
*C22C 5/04* (2006.01)
*C22C 19/07* (2006.01)
*C23C 14/08* (2006.01)
*C23C 14/34* (2006.01)

(52) U.S. Cl.
CPC ........... *C23C 14/34* (2013.01); *H01J 37/3414* (2013.01); *H01J 37/3426* (2013.01); *H01J 37/3429* (2013.01)

(58) Field of Classification Search
CPC . G11B 5/65; G11B 5/656; G11B 5/851; H01J 37/3426; H01J 37/3429; H01J 37/3414
USPC ....................................... 204/298.12, 298.13
See application file for complete search history.

(56) References Cited

U.S. PATENT DOCUMENTS

| 2015/0036243 A1 | 2/2015 | Inoue et al. |
| 2016/0276143 A1 | 9/2016 | Goto et al. |
| 2017/0194131 A1 | 7/2017 | Tham et al. |

FOREIGN PATENT DOCUMENTS

| TW | 201522691 A | 6/2015 |
| TW | 201606092 A | 2/2016 |
| WO | 2016/133047 A1 | 8/2016 |

OTHER PUBLICATIONS

Piramanayagam, S. N., "Perpendicular recording media for hard disk drives," Journal of Applied Physics, 2007, vol. 102, pp. 011301-1-011301-22.
Piramanayagam et al., "Grain size reduction in CoCrPt: SiO2 perpendicular recording media with oxide-based intermediate layers," Applied Physics Letters, 2006, vol. 89, pp. 162504-1-162504-3.
Inaba et al., "Optimization of the SiO2 Content in CoPtCr—SiO2 Perpendicular Recording Media for High-Density Recording," IEEE Transactions on Magnetics, Jul. 2004, vol. 40, No. 4, pp. 2486-2488.
Tamai et al., "Magnetic and Recording Characteristics of CoCrPt-Oxide Media With a Mixture of SiO2 and TiO2," IEEE Transactions on Magnetics, Nov. 2008, vol. 44, No. 11, pp. 3492-3495.
Nov. 28, 2017 International Search Report issued in International Patent Application No. PCT/JP2017/036824.

* cited by examiner

(A) Example 1

(B) Example 4

(C) Comparative Example 1

FIG. 6

SPUTTERING TARGET FOR MAGNETIC RECORDING MEDIA

TECHNICAL FIELD

The present invention relates to a sputtering target for magnetic recording media, and in particular, to a sputtering target that contains metallic Co, metallic Pt, and an oxide.

BACKGROUND ART

In a magnetic disk for a hard disk drive, information signals are recorded in fine bits of a magnetic recording medium. In order to further improve the recording density of the magnetic recording medium, it is necessary to increase the ratio of signal to noise, which is an index of the information quality, while reducing the size of the bit holding one piece of recording information. In order to increase the ratio of signal to noise, it is essential to increase the signal or reduce the noise.

At present, a magnetic thin film having a granular structure of a CoPt-based alloy-oxide is utilized as a magnetic recording medium that serve to record information signals (see, for example, Non-Patent Literature 1). The granular structure is composed of columnar CoPt-based alloy crystal grains and crystal grain boundaries formed from an oxide that surrounds the columnar CoPt-based alloy crystal grains.

When the recording density of such a magnetic recording medium is increased, it is necessary to smoothen transitional regions between recording bits to reduce noise. In order to smoothen the transitional regions between the recording bits, it is essential to micronize the CoPt-based alloy crystal grains contained in the magnetic thin film.

As the magnetic crystal grains become finer, the intensity of the recording signal that one magnetic crystal grain can hold becomes smaller. In order to achieve both the micronization of the magnetic crystal grains and the intensity of the recording signal, it is necessary to reduce the distance between the centers of the crystal grains.

On the other hand, the progress of micronization of the CoPt-based alloy crystal grains in a magnetic recording medium has sometimes resulted in occurrence of the so-called thermal fluctuation phenomenon, in which the super-paramagnetic phenomenon impairs the thermal stability of recorded signals and leads to loss of the recorded signals. This thermal fluctuation phenomenon has contributed a major obstacle to increasing the recording density of magnetic disks.

In order to surmount this obstacle, the magnetic energy of respective CoPt-based alloy crystal grains needs to be increased such that the magnetic energy exceeds the thermal energy. The magnetic energy of respective CoPt-based alloy crystal grains is obtained by $v \times K_u$, which is a product of the volume v of the CoPt-based alloy crystal grains and the magnetocrystalline anisotropy constant $K_u$. Therefore, the magnetocrystalline anisotropy constant $K_u$ of the CoPt-based alloy crystal grains needs to be increased in order to increase the magnetic energy of the CoPt-based alloy crystal grains (see, for example, Non-Patent Literature 2).

In addition, in order to grow the CoPt-based alloy crystal grains having large $K_u$ in a columnar shape, phase separation between the CoPt-based alloy crystal grains and grain boundary material must be achieved. If the phase separation between the CoPt-based alloy crystal grains and the grain boundary material is insufficient to increase the grain interaction between the CoPt-based alloy crystal grains, the magnetic thin film having the granular structure of the CoPt-based alloy-oxide has had reduced coercive force Hc. As a result, the thermal stability is impaired, and the thermal fluctuation phenomenon may occur with ease. Thus, it is important to reduce the grain interaction between the CoPt-based alloy crystal grains.

The micronization of the magnetic crystal grains and the reduction of the distance between the centers of the magnetic crystal grains may be achieved by micronizing the crystal grains in the Ru underlayer (underlayer provided for orientation control of the magnetic recording medium).

However, it is difficult to micronize crystal grains in the Ru underlayer while maintaining the crystal orientation (see, for example, Non-Patent Literature 3). Therefore, the size of the crystal grains in the Ru underlayer of the current magnetic recording medium is almost the same as that when the longitudinal magnetic recording media are switched to the perpendicular magnetic recording media, and is about 7 to 8 nm.

From the viewpoint of improving the magnetic recording layer instead of the Ru underlayer, an investigation has been made to advance the micronization of magnetic crystal grains. Specifically, an investigation was made to increase the addition amount of the oxide in the CoPt-based alloy-oxide magnetic thin film to decrease the volume ratio of the magnetic crystal grains to micronize the magnetic crystal grains (see, for example, Non-Patent Literature 4). This technique achieved the micronization of the magnetic crystal grains, but has not been able to reduce the distance between the centers of the magnetic crystal grains because the width of the crystal grain boundary increases due to an increase in the addition amount of the oxide.

In addition, an investigation was made to add a second oxide in addition to the single oxide used in the conventional CoPt-based alloy-oxide magnetic thin film (see, for example, Non-Patent Literature 5). However, when a plurality of oxide materials is added, there is no clear guideline for selecting the materials, and even today, the investigation for searching oxides used as grain boundary materials for the CoPt-based alloy crystal grains is being continued.

CITATION LIST

Non-Patent Literature

Non-Patent Literature 1: T. Oikawa et al., IEEE TRANSACTIONS ON MAGNETICS, September 2002, VOL. 38, NO. 5, p. 1976-1978

Non-Patent Literature 2: S. N. Piramanayagam, JOURNAL OF APPLIED PHYSICS, 2007, 102, 011301

Non-Patent Literature 3: S. N. Piramanayagam et al., APPLIED PHYSICS LETTERS, 2006, 89, 162504

Non-Patent Literature 4: Y. Inaba et al., IEEE TRANSACTIONS ON MAGNETICS, July 2004, VOL. 40, NO. 4, p. 2486-2488 Non-Patent Literature 5: I. Tamai et al., IEEE TRANSACTIONS ON MAGNETICS, November 2008, VOL. 44, NO. 11, p. 3492-3495

SUMMARY OF INVENTION

Technical Problem

The present invention has been made under such circumstances, and an object of the present invention is to provide a sputtering target for magnetic recording media capable of producing a magnetic thin film in which the magnetic crystal grains are micronized and the distance between the centers of the magnetic crystal grains is reduced while good magnetic properties are maintained.

Solution to Problem

The inventor of the present invention has diligently carried out studies to solve the above-mentioned problems. As a result, the inventor has found that, in order to realize the micronization of magnetic crystal grains in a magnetic thin film and the reduction of the distance between the centers of the magnetic crystal grains, it is effective to make a sputtering target for magnetic recording media contain oxides having a low melting point and a high melting point (specifically, make the sputtering target contain $B_2O_3$ having a melting point as low as 450° C. and a high-melting-point oxide having a melting point higher than the melting point of the CoPt alloy (about 1450° C.)).

The present invention has been made on the basis of this new findings.

Namely, a first aspect of a sputtering target for magnetic recording media according to the present invention is a sputtering target for magnetic recording media comprising metallic Pt and an oxide, with the balance being metallic Co and inevitable impurities, wherein the metallic Co is contained in a range of 70 at % or more and 90 at % or less and the metallic Pt is contained in a range of 10 at % or more and 30 at % or less relative to a total of metallic components in the sputtering target for magnetic recording media, the oxide is contained in a range of 26 vol % or more and 40 vol % or less relative to a total volume of the sputtering target for magnetic recording media, and the oxide is composed of $B_2O_3$ and one or more high-melting-point oxides having a melting point of 1470° C. or higher and 2800° C. or lower.

A second aspect of a sputtering target for magnetic recording media according to the present invention is a sputtering target for magnetic recording media comprising metallic Pt, metallic Cr, and an oxide, with the balance being metallic Co and inevitable impurities, wherein the metallic Co is contained in a range of 70 at % or more and less than 90 at %, the metallic Pt is contained in a range of 10 at % or more and less than 30 at %, and the metallic Cr is contained in a range of more than 0 at % and 10 at % or less, relative to a total of metallic components in the sputtering target for magnetic recording media, the oxide is contained in a range of 26 vol % or more and 40 vol % or less relative to a total volume of the sputtering target for magnetic recording media, and the oxide is composed of $B_2O_3$ and one or more high-melting-point oxides having a melting point of 1470° C. or higher and 2800° C. or lower.

It is preferable that a volume ratio of $B_2O_3$ relative to a total of the one or more high-melting-point oxides is 0.5 or more and 4 or less.

The one or more high-melting-point oxides may be selected from the group consisting of $TiO_2$, $SiO_2$, $Ta_2O_5$, $Cr_2O_3$, $Al_2O_3$, and $ZrO_2$.

It is preferable that the one or more high-melting-point oxides are $TiO_2$.

Advantageous Effects of Invention

The present invention can provide a sputtering target for magnetic recording media capable of producing a magnetic thin film in which the magnetic crystal grains are micronized and the distance between the centers of the magnetic crystal grains is reduced while good magnetic properties are maintained.

BRIEF DESCRIPTION OF DRAWINGS

FIG. 1(A) is a schematic diagram showing an initial stage of growth of the granular medium (granular medium 10), and FIG. 1(B) is a schematic diagram showing an advanced stage of growth of the granular medium (granular medium 20).

FIG. 2(A) is a schematic diagram showing an initial stage of growth of the granular medium (granular medium 30), and FIG. 2(B) is a schematic diagram showing an advanced stage of growth of the granular medium (granular medium 40).

DESCRIPTION OF EMBODIMENTS (1) First Embodiment

A sputtering target for magnetic recording media according to a first embodiment of the present invention contains metallic Pt and an oxide, with the balance being metallic Co and inevitable impurities, and is characterized in that the metallic Co is contained in a range of 70 at % or more and 90 at % or less and the metallic Pt is contained in a range of 10 at % or more and 30 at % or less relative to a total of metallic components in the sputtering target for magnetic recording media, the oxide is contained in a range of 26 vol % or more and 40 vol % or less relative to a total volume of the sputtering target for magnetic recording media, and the oxide is composed of $B_2O_3$ and one or more high-melting-point oxides having a melting point of 1470° C. or higher and 2800° C. or lower.

In the present description, a sputtering target for magnetic recording media may be referred to simply as a sputtering target or a target. In the present description, metallic Co may be simply described as Co, metallic Pt may be simply described as Pt, and metallic Cr may be simply described as Cr.

(1-1) Component of Sputtering Target

A sputtering target for magnetic recording media according to this first embodiment contains Co and Pt as metal components, and does not contain other metals except for inevitable impurities.

Metallic Co and metallic Pt are components of magnetic crystal grains (fine magnet) in the granular structure of the magnetic thin film formed by sputtering.

Co is a ferromagnetic metal element and plays a central role in the formation of the magnetic crystal grains (fine magnet) in the granular structure of the magnetic thin film. In order to increase the magnetocrystalline anisotropy constant $K_u$ of the CoPt alloy crystal grains (magnetic crystal grains) in the magnetic thin film obtained by sputtering and to maintain the magnetism of the CoPt alloy crystal grains (magnetic crystal grains) in the obtained magnetic thin film, the content percentage of Co in the sputtering target according to this first embodiment is 70 at % or more and 90 at % or less relative to the total metallic components (the total of Co and Pt).

Platinum, when alloying with Co in a predetermined composition range, has the function of reducing the magnetic moment of the alloy and thus has a role of adjusting the magnetic strength of the magnetic crystal grains. In order to increase the magnetocrystalline anisotropy constant $K_u$ of the CoPt alloy crystal grains (magnetic crystal grains) in the magnetic thin film obtained by sputtering and to adjust the magnetism of the CoPt alloy grains (magnetic crystal grains) in the obtained magnetic thin film, the content percentage of Pt in the sputtering target according to this first embodiment is 10 at % or more and 30 at % or less relative to the total metallic components (the total of Co and Pt).

The oxide components of the sputtering target according to this first embodiment are composed of $B_2O_3$ and one or more high-melting-point oxides having a melting point of 1470° C. or higher and 2800° C. or lower (hereinafter, sometimes simply referred to as high-melting-point oxide). The oxide component serves as a non-magnetic matrix that separates the magnetic crystal grains (fine magnet) from each other in the granular structure of the magnetic thin film.

Figure 1:
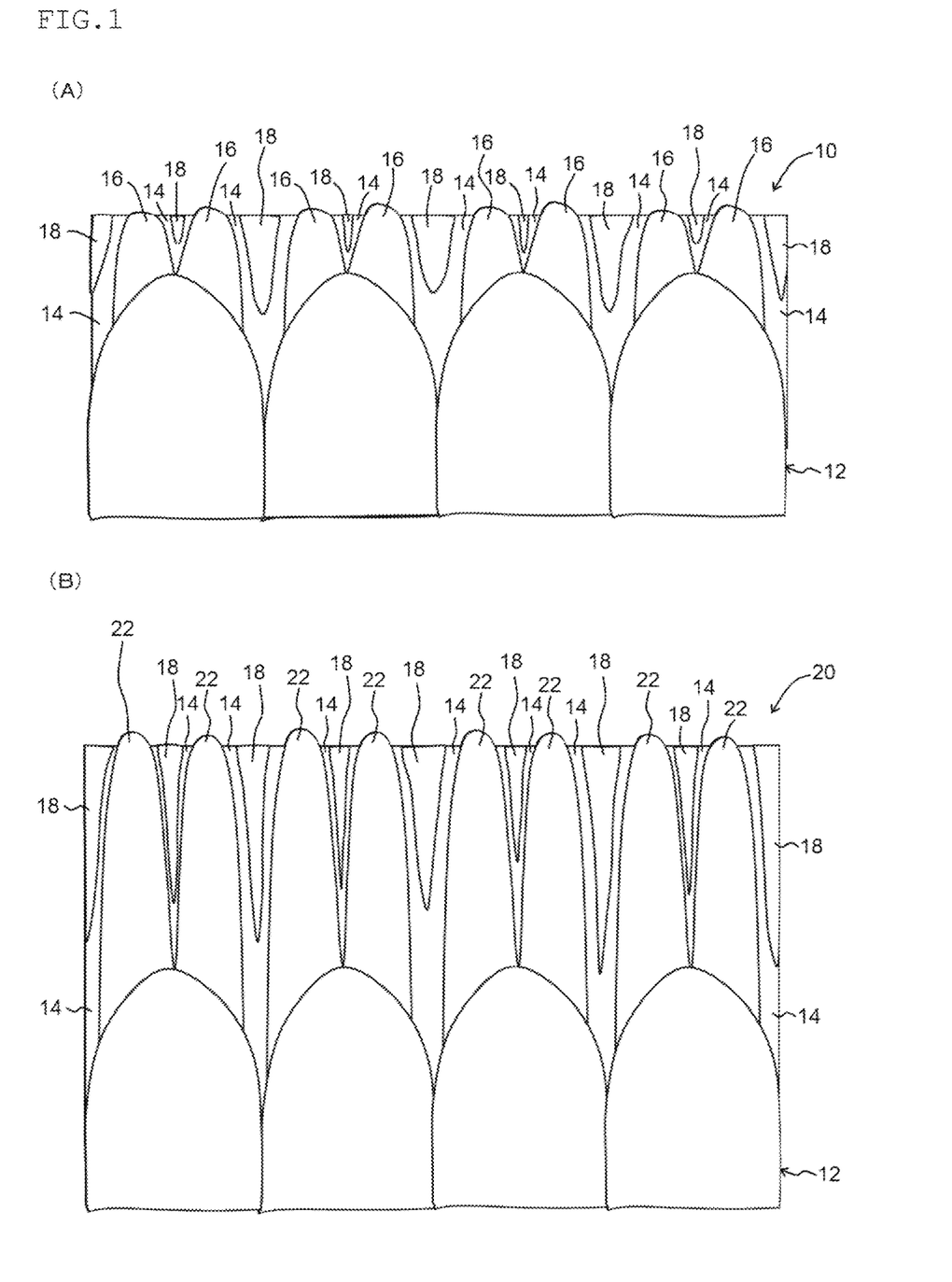
FIG. 1 includes schematic diagrams showing a growth process when a granular medium is formed by sputtering using the sputtering target according to first embodiment of the present invention.

FIG. 1 includes schematic diagrams showing a growth process when a granular medium (hereinafter, a magnetic thin film may be referred to as a granular medium) is formed by sputtering using the sputtering target according to this first embodiment. FIG. 1(A) is a schematic diagram showing an initial stage of growth of the granular medium (granular medium 10), and FIG. 1(B) is a schematic diagram showing an advanced stage of growth of the granular medium (granular medium 20).

The melting point of the high-melting-point oxide used in the sputtering target according to this first embodiment is 1470° C. or higher and 2800° C. or lower, which is higher than the melting point of the CoPt alloy serving as the magnetic crystal grains. Therefore, in the film formation process by sputtering using the sputtering target according to this first embodiment, the high-melting-point oxide 14 is deposited on the projected portions of the Ru underlayer 12, which are points where the CoPt alloy is likely to be deposited, prior to the deposition of the CoPt alloy. Therefore, the crystal of the CoPt alloy is grown in a form divided by the deposited high-melting-point oxide 14 as schematically illustrated in FIGS. 1(A) and 1(B), whereby grain growth of the CoPt alloy crystal grains (magnetic crystal grains) 16 in the in-plane direction (in the plane direction perpendicular to the height direction of the columnar CoPt alloy crystal grains 16) is suppressed. Therefore, the CoPt alloy crystal grains 16 grow into the CoPt alloy crystal grains 22 in a columnar shape, and are micronized in the in-plane directions.

Among the oxide components, the oxide component which is not a high-melting-point oxide is $B_2O_3$ (indicated by reference numeral 18 in FIGS. 1 and 2), and $B_2O_3$ has a low melting point of 450° C. Therefore, in the sputtering-based film formation process, the deposition time of $B_2O_3$ is delayed, and $B_2O_3$ is present in a liquid state between the columnar CoPt alloy crystal grains during the columnar crystal growth of the CoPt alloy crystal grains (during the crystal growth of the CoPt alloy crystal grains 16 to the CoPt alloy crystal grains 22). Therefore, $B_2O_3$ is finally deposited so as to form a crystal grain boundary which separates the CoPt alloy crystal grains 22 grown in a columnar shape, and serves as a non-magnetic matrix which separates the magnetic crystal grains (fine magnets) in the granular structure of the magnetic thin film.

Figure 2:
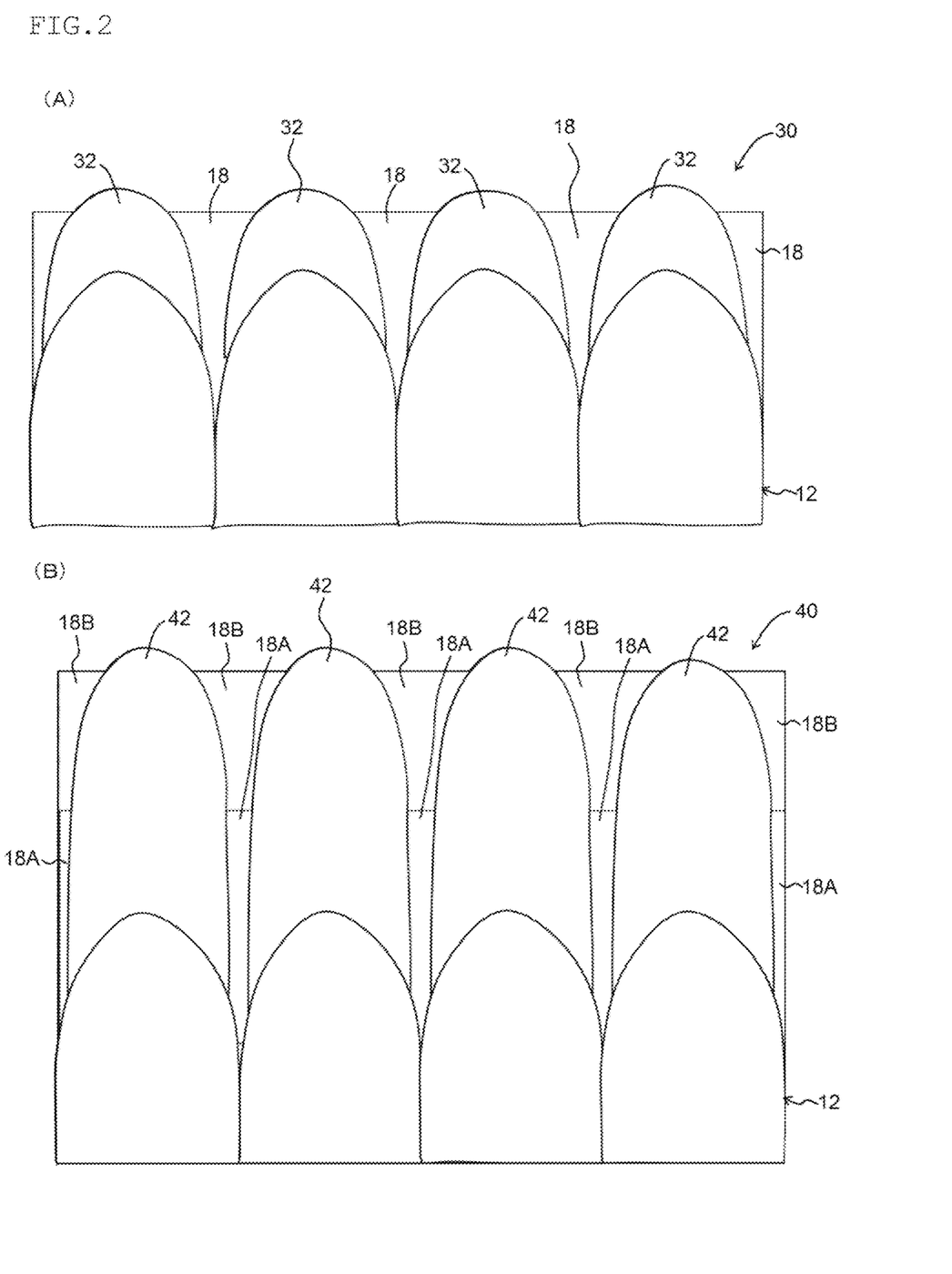
FIG. 2 includes schematic diagrams showing a growth process when a granular medium is formed by sputtering using a sputtering target that uses only $B_2O_3$ as the oxide component.

FIG. 2 includes schematic diagrams showing a growth process when a granular medium is formed by sputtering using the sputtering target that uses only $B_2O_3$ as the oxide component. FIG. 2(A) is a schematic diagram showing an initial stage of growth of the granular medium (granular medium 30), and FIG. 2(B) is a schematic diagram showing an advanced stage of growth of the granular medium (granular medium 40).

When sputtering is performed using a sputtering target that uses only $B_2O_3$ as the oxide component to form a granular medium, since the melting point of $B_2O_3$, which is the oxide component, is as low as 450° C., the CoPt alloy having a melting point of about 1450° C. is first deposited on the projected portions of the Ru underlayer 12. Therefore, one CoPt alloy crystal grain 32 is deposited on one projected portion of the Ru underlayer 12, and the deposited CoPt alloy crystal grains 32 (see FIG. 2(A)) grow like the CoPt alloy crystal grains 42 (see FIG. 2(B)), so that the granular medium further grows.

When sputtering is performed using a sputtering target that uses only $B_2O_3$ as the oxide component to form a granular medium, one CoPt alloy crystal grain 32 is deposited and grown on one projected portion of the Ru underlayer 12. Therefore, it is difficult to micronize the CoPt alloy crystal grains 42 in the in-plane direction beyond the distribution of the projected portions of the Ru underlayer 12.

In FIG. 2(B), reference numeral 18A denotes $B_2O_3$ which has been deposited to become a solid, and reference numeral 18B denotes liquid-state $B_2O_3$.

The upper limit value of the melting point of the high-melting-point oxide used in the sputtering target according to this first embodiment is 2800° C. A magnetic thin film produced using a sputtering target (Comparative Example 10 indicated in the table 1) for magnetic recording media that used MgO having a melting point (2852° C.) exceeding 2800° C. as the oxide component had no good magnetic properties, although the reason was unknown. Therefore, the upper limit value of the melting point of the high-melting-point oxide used in the sputtering target according to this first embodiment was defined to 2800° C.

In the sputtering target according to this first embodiment, the total content percentage of the metal components and the total content percentage of the oxide components relative to the entire sputtering target are determined on the basis of the component composition of the target magnetic thin film, and are not particularly limited. However, the total content percentage of the metal components relative to the entire sputtering target may be, for example, 88 mol % or more and 94 mol % or less, and the total content percentage of the oxide component relative to the entire sputtering target may be, for example, 6 mol % or more and 12 mol % or less.

As described above, in the granular structure of the magnetic thin film, the oxide components serve as a non-magnetic matrix that separates the magnetic crystal grains (fine magnets) from each other. Therefore, it is preferable to increase the content of the oxides in the magnetic thin film because the magnetic crystal grains can be reliably and easily separated and the magnetic crystal grains can be easily made independent of each other. From this point of view, the content of the oxides contained in the sputtering target according to this first embodiment is preferably 26 vol % or more, more preferably 28 vol % or more, and further preferably 29 vol % or more.

However, if the content of the oxides in the magnetic thin film becomes too large, the oxides are mixed into the CoPt alloy crystal grains (magnetic crystal grains) and adversely affect the crystallinity of the CoPt alloy crystal grains (magnetic crystal grains). As a result, the proportion of structures other than the hcp in the CoPt alloy crystal grains (magnetic crystal grains) may increase. This also reduces the number of the magnetic crystal grains per unit area in the magnetic thin film, and thus makes it difficult to increase the recording density. From these points of view, the content of the oxides contained in the sputtering target according to this first embodiment is preferably 40 vol % or less, more preferably 35 vol % or less, and further preferably 31 vol % or less.

The content of the oxides contained in the sputtering target according to this first embodiment relative to the entire sputtering target is preferably 26 vol % or more and 40 vol % or less, more preferably 28 vol % or more and 35 vol % or less, and further preferably 29 vol % or more and 31 vol % or less.

As described above, the oxide components contained in the sputtering target according to this first embodiment are composed of $B_2O_3$ and one or more high-melting-point oxides having a melting point of 1470° C. or higher and 2800° C. or lower. The volume ratio of $B_2O_3$ relative to the total of the one or more high-melting-point oxides is preferably 0.5 or more and 4.0 or less, more preferably 0.7 or more and 3.5 or less, and further preferably 0.8 or more and 3.0 or less from the viewpoint of depositing the high-melting-point oxide on the projected portions of the Ru underlayer by an appropriate amount prior to the deposition of the CoPt alloy to make the CoPt alloy crystal grains (magnetic crystal grains) appropriately fine.

Examples of the high-melting-point oxide that can be the oxide component of the sputtering target according to this first embodiment include $TiO_2$, $SiO_2$, $Ta_2O_5$, $Cr_2O_3$, $Al_2O_3$, and $ZrO_2$. From the viewpoint of micronization of the magnetic crystal grains in the magnetic thin film and reduction of the distance between the centers of the magnetic crystal grains, the high-melting-point oxide contained in the sputtering target according to this first embodiment is preferably one or more types of oxides selected from the group consisting of $TiO_2$, $SiO_2$, $Ta_2O_5$, $Cr_2O_3$, $Al_2O_3$, and $ZrO_2$, and is more preferably $TiO_2$.

(1-2) Microstructure of Sputtering Target

The microstructure of the sputtering target according to this first embodiment is not particularly limited, but is preferably a microstructure in which a metal phase and an oxide phase are finely dispersed in each other. Such a microstructure makes it difficult to generate defects such as nodules and particles during sputtering.

(1-3) Process for Production of Spattering Target

The sputtering target according to this first embodiment can be produced, for example, in the following manner.

(1-3-1) Preparation of CoPt Alloy-Atomized Powder

Co and Pt are weighed so as to obtain a prescribed composition (the atomic ratio of metallic Co to the total of the metallic Co and metallic Pt is 70 at % or more and 90 at % or less), and a molten CoPt alloy is produced. Subsequently, the molten CoPt alloy is gas-atomized to prepare a CoPt alloy-atomized powder. The produced CoPt alloy-atomized powder is classified so that the particle size becomes not larger than a predetermined particle size (for example, 106 μm or smaller).

(1-3-2) Preparation of Powder Mixture for Pressure Sintering

A $B_2O_3$ powder and high-melting-point oxides powder (for example, $TiO_2$ powder, $SiO_2$ powder, $Ta_2O_5$ powder, $Cr_2O_3$ powder, $Al_2O_3$ powder, and $ZrO_2$ powder) are added to the CoPt alloy-atomized powder prepared in (1-3-1). The mixture is dispersedly mixed with a ball mill to prepare a powder mixture for pressure sintering. By dispersedly mixing the CoPt alloy-atomized powder, the $B_2O_3$ powder, and the high-melting-point oxides powder with the ball mill, a powder mixture for pressure sintering in which the CoPt alloy-atomized powder, the $B_2O_3$ powder, and high-melting-point oxides powder are finely dispersed in each other can be prepared.

In the magnetic thin film formed by using the obtained sputtering target, the volume fraction of the total of the $B_2O_3$ powder and the high-melting-point oxides powder in the entire powder mixture for pressure sintering is preferably 26 vol % or more and 40 vol % or less, more preferably 28 vol % or more and 35 vol % or less, and still more preferably 29 vol % or more and 31 vol % or less in order to easily make the magnetic crystal grains independent from each other by assuredly separating the magnetic crystal grains from each other by $B_2O_3$ and high-melting-point oxides, to makes it easy for the CoPt alloy crystal grains (magnetic crystal grains) to have the hcp structure, and to increase the recording density.

(1-3-3) Molding

The powder mixture for pressure sintering prepared in (1-3-2) is pressure-sintered and molded using, for example, a vacuum hot pressing method to produce a spattering target. Since the powder mixture for pressure sintering prepared in (1-3-2) has been dispersedly mixed with a ball mill and the CoPt alloy-atomized powder and the oxides powder (the $B_2O_3$ powder and the high-melting-point oxides) are finely dispersed in each other, defects such as generation of nodules and particles are unlikely to occur during sputtering using the spattering target obtained by this production process.

The method for pressure-sintering the powder mixture for pressure sintering is not limited. The method may be a method other than a vacuum hot pressing method and may be, for example, a HIP method.

(1-3-4) Modification

The example of production process described in (1-3-1) to (1-3-3) involves preparing the CoPt alloy-atomized powder by an atomizing method, adding the $B_2O_3$ powder and the high-melting-point oxides powder to the prepared CoPt alloy-atomized powder, and dispersedly mixing the mixture with the ball mill to prepare the powder mixture for pressure sintering. A Co single powder and a Pt single powder may be used instead of using the CoPt alloy-atomized powder. In such a case, four types of powder, which are a Co single powder, a Pt single powder, a $B_2O_3$ powder, and a high-melting-point oxide powder are dispersedly mixed with a ball mill to prepare a powder mixture for pressure sintering.

(2) Second Embodiment

A sputtering target for magnetic recording media according to a second embodiment of the present invention contains metallic Pt, metallic Cr, and an oxide, with the balance being metallic Co and inevitable impurities, and is characterized in that the metallic Co is contained in a range of 70 at % or more and less than 90 at %, the metallic Pt is contained in a range of 10 at % or more and less than 30 at %, and the metallic Cr is contained in a range of more than 0 at % and 10 at % or less, relative to a total of metallic components in the sputtering target for magnetic recording media, the oxide is contained in a range of 26 vol % or more and 40 vol % or less relative to a total volume of the sputtering target for magnetic recording media, and the oxide is composed of $B_2O_3$ and one or more high-melting-point oxides having a melting point of 1470° C. or higher and 2800° C. or lower.

(2-1) Component of Sputtering Target

A sputtering target for magnetic recording media according to this second embodiment contains Co, Pt, and Cr as metal components, and does not contain other metals except for inevitable impurities.

The roles of the metallic Co and the metallic Pt in the sputtering target for magnetic recording media according to this second embodiment are the same as the roles of the metallic Co and the metallic Pt in the sputtering target for magnetic recording media according to the first embodiment, and therefore a description thereof is omitted here.

Cr has a function of reducing the magnetic moment of Co when alloyed with Co within a prescribed composition range and plays a role in controlling the strength of the magnetism of the magnetic crystal grains.

In order to increase the magnetocrystalline anisotropy constant $K_u$ of the CoPtCr alloy crystal grains (magnetic crystal grains) in the magnetic thin film obtained by sputtering and to maintain the magnetism of the CoPtCr alloy crystal grains in the obtained magnetic thin film, the content percentage of Co in the sputtering target according to this second embodiment is 70 at % or more and less than 90 at % relative to the total metallic components (the total of Co, Pt, and Cr), the content percentage of Pt in the sputtering target according to this second embodiment is 10 at % or more and less than 30 at % relative to the total metallic components (the total of Co, Pt, and Cr), and the content percentage of Cr in the sputtering target according to this second embodiment is more than 0 at % and 10 at % or less relative to the total metallic components (the total of Co, Pt, and Cr).

The oxide components of the sputtering target according to this second embodiment are composed of $B_2O_3$ and one or more high-melting-point oxides having a melting point of 1470° C. or higher and 2800° C. or lower. The oxide component serves as a non-magnetic matrix that separates the magnetic crystal grains (fine magnet) from each other in the granular structure of the magnetic thin film.

The melting point of the high-melting-point oxide used in the sputtering target according to this second embodiment is 1470° C. or higher and 2800° C. or lower, which is higher than the melting point of the CoPtCr alloy serving as the magnetic crystal grains. Therefore, in the film formation process (the growth process of a granular medium) by sputtering using the sputtering target according to this second embodiment, the high-melting-point oxide is deposited on the projected portions of the Ru underlayer, which are points where the CoPtCr alloy is likely to be deposited, prior to the deposition of the CoPtCr alloy. Therefore, the crystal of the CoPtCr alloy is grown in a form divided by the deposited high-melting-point oxide, whereby grain growth of the CoPtCr alloy crystal grains in the in-plane direction (in the plane direction perpendicular to the height direction of the columnar CoPtCr alloy crystal grains) is suppressed.

Therefore, the CoPtCr alloy crystal grains (magnetic crystal grains) grow in a columnar shape, and are micronized in the in-plane directions.

Among the oxide components, the oxide component which is not a high-melting-point oxide is $B_2O_3$, and $B_2O_3$ has a low melting point of 450° C. Therefore, in the sputtering-based film formation process, the deposition time of $B_2O_3$ is delayed, and $B_2O_3$ is present in a liquid state between the columnar CoPtCr alloy crystal grains during the columnar crystal growth of the CoPtCr alloy crystal grains. Therefore, $B_2O_3$ is finally deposited so as to form a crystal grain boundary which separates the CoPtCr alloy crystal grains grown in a columnar shape, and serves as a non-magnetic matrix which separates the magnetic crystal grains (fine magnets) in the granular structure of the magnetic thin film.

The upper limit value of the melting point of the high-melting-point oxide used in the sputtering target according to this second embodiment is 2800° C. A magnetic thin film produced using a sputtering target (Comparative Example 10 described later) for magnetic recording media that used MgO having a melting point (2852° C.) exceeding 2800° C. as the oxide component had no good magnetic properties, although the reason was unknown. Therefore, the upper limit value of the melting point of the high-melting-point oxide used in the sputtering target according to this second embodiment was defined to 2800° C.

In the sputtering target according to this second embodiment, the total content percentage of the metal components and the total content percentage of the oxide components relative to the entire sputtering target are determined on the basis of the component composition of the target magnetic thin film, and are not particularly limited. However, the total content percentage of the metal components relative to the entire sputtering target may be, for example, 88 mol % or more and 94 mol % or less, and the total content percentage of the oxide component relative to the entire sputtering target may be, for example, 6 mol % or more and 12 mol % or less.

As described above, in the granular structure of the magnetic thin film, the oxide components serve as a non-magnetic matrix that separates the magnetic crystal grains (fine magnets) from each other. Therefore, it is preferable to increase the content of the oxides in the magnetic thin film because the magnetic crystal grains can be reliably and easily separated and the magnetic crystal grains can be easily made independent of each other. From this point of view, the content of the oxides contained in the sputtering target according to this second embodiment is preferably 26 vol % or more, more preferably 28 vol % or more, and further preferably 29 vol % or more.

However, if the content of the oxides in the magnetic thin film becomes too large, the oxides are mixed into the CoPtCr alloy crystal grains (magnetic crystal grains) and adversely affect the crystallinity of the CoPtCr alloy crystal grains (magnetic crystal grains). As a result, the proportion of structures other than the hcp in the CoPtCr alloy crystal grains (magnetic crystal grains) may increase. This also reduces the number of the magnetic crystal grains per unit area in the magnetic thin film, and thus makes it difficult to increase the recording density. From these points of view, the content of the oxides contained in the sputtering target according to this second embodiment is preferably 40 vol % or less, more preferably 35 vol % or less, and further preferably 31 vol % or less.

The content of the oxides contained in the sputtering target according to this second embodiment relative to the entire sputtering target is preferably 26 vol % or more and 40 vol % or less, more preferably 28 vol % or more and 35 vol % or less, and further preferably 29 vol % or more and 31 vol % or less.

As described above, the oxide components contained in the sputtering target according to this second embodiment are composed of $B_2O_3$ and one or more high-melting-point oxides having a melting point of 1470° C. or higher and 2800° C. or lower. The volume ratio of $B_2O_3$ relative to the total of the one or more high-melting-point oxides is preferably 0.5 or more and 4.0 or less, more preferably 0.7 or more and 3.5 or less, and further preferably 0.8 or more and 3.0 or less from the viewpoint of depositing the high-melting-point oxide on the projected portions of the Ru underlayer by an appropriate amount prior to the deposition of the CoPt alloy to make the CoPtCr alloy crystal grains (magnetic crystal grains) appropriately fine.

Examples of the high-melting-point oxide that can be the oxide component of the sputtering target according to this second embodiment include $TiO_2$, $SiO_2$, $Ta_2O_5$, $Cr_2O_3$, $Al_2O_3$, and $ZrO_2$. From the viewpoint of micronization of the magnetic crystal grains in the magnetic thin film and reduction of the distance between the centers of the magnetic crystal grains, the high-melting-point oxide contained in the sputtering target according to this second embodiment is preferably one or more types of oxides selected from the group consisting of $TiO_2$, $SiO_2$, $Ta_2O_5$, $Cr_2O_3$, $Al_2O_3$, and $ZrO_2$, and is more preferably $TiO_2$.

(2-2) Microstructure of Sputtering Target

The microstructure of the sputtering target according to this second embodiment is not particularly limited, but is preferably a microstructure in which a metal phase and an oxide phase are finely dispersed in each other. Such a microstructure makes it difficult to generate defects such as nodules and particles during sputtering.

(2-3) Process for Production of Sputtering Target

The process for production of the sputtering target according to the second embodiment differs from the process for production of the sputtering target according to the first embodiment in that a CoPtCr alloy-atomized powder having a predetermined composition is prepared instead of the CoPt alloy-atomized powder having a predetermined composition, but the other points are the same as those of the process for production of the sputtering target according to the first embodiment, and therefore descriptions thereof are omitted here.

In the process for production of the sputtering target according to this second embodiment, a Co single powder, a Pt single powder, and a Cr single powder may be used instead of producing the CoPtCr alloy-atomized powder having a predetermined composition. In such a case, five types of powder, which are a Co single powder, a Pt single powder, a Cr single powder, a $B_2O_3$ powder, and a high-melting-point oxide powder are dispersedly mixed with a ball mill to prepare a powder mixture for pressure sintering.

EXAMPLES

Examples and Comparative Examples are described below.

Example 1

The composition of the entire target prepared as Example 1 is (80Co-20Pt)-15 vol % $B_2O_3$-15 vol % $TiO_2$, and is represented as 89.3(80Co-20Pt)-3.6$B_2O_3$-7.1$TiO_2$ in terms of molar ratio.

To prepare the target according to Example 1, an 80Co-20Pt alloy-atomized powder was prepared first. Specifically, metals were weighed so as to obtain an alloy composition of Co: 80 at % and Pt: 20 at % and heated to 1500° C. or higher to prepare a molten alloy. The molten alloy was gas-atomized to prepare an 80Co-20Pt alloy-atomized powder.

The prepared 80Co-20Pt alloy-atomized powder was separately classified through 150 mesh sieves to obtain 80Co-20Pt alloy-atomized powder having a particle diameter of 106 μm or smaller.

In order to obtain the composition of (80Co-20Pt)-15 vol % $B_2O_3$-15 vol % $TiO_2$, a $B_2O_3$ powder and a $TiO_2$ powder were added to the classified 80Co-20Pt alloy-atomized powder, and mixed and dispersed with a ball mill to obtain a mixed powder for pressure sintering.

The obtained powder mixture for pressure sintering was subjected to hot pressing under the conditions of sintering temperature: 920° C., pressure: 24.5 MPa, time: 30 min, and atmosphere: $5 \times 10^{-2}$ Pa or lower to prepare a sintered test piece (φ30 mm). The relative density of the prepared sintered test piece was 97.419%. The calculated density is 9.39 g/cm³. The cross section in the thickness direction of the obtained sintered test piece was observed with a metallograph, and it was found that the metal phase (80Co-20Pt alloy phase) and the oxide phase ($B_2O_3$+$TiO_2$ phase) were finely dispersed.

Next, the prepared powder mixture for pressure sintering was subjected to hot pressing under the conditions of sintering temperature: 920° C., pressure: 24.5 MPa, time: 60 min, and atmosphere: $5 \times 10^{-2}$ Pa or lower to prepare a target with φ153.0×1.0 mm+φ161.0×4.0 mm. The relative density of the prepared target was 98.4%.

A magnetic thin film made of (80Co-20Pt)-15 vol % $B_2O_3$-15 vol % $TiO_2$ was deposited on a glass substrate by sputtering with DC sputtering device using the prepared target to produce a sample for determining magnetic properties and a sample for observing texture. The stacked structure of these samples includes, in order of increasing distance from the glass substrate, Ta (5 nm, 0.6 Pa)/$Ni_{90}W_{10}$ (6 nm, 0.6 Pa)/Ru (10 nm, 0.6 Pa)/Ru (10 nm, 8 Pa)/CoPt alloy-oxide (16 nm, 4 Pa)/C (7 nm, 0.6 Pa). The number on the left side in parenthesis indicates the film thickness, and the number on the right side indicates the pressure of an Ar atmosphere during sputtering. The magnetic thin film formed using the target that is prepared in this Example 1 is formed of a CoPt alloy-oxide ($B_2O_3$+$TiO_2$) and is a magnetic thin film serving as a recording layer of a perpendicular magnetic recording medium. This magnetic thin film was deposited at room temperature without heating the substrate during film deposition.

A vibration type magnetometer and a torque magnetometer were used to determine the magnetic properties of the obtained sample for determining magnetic properties, and a polar Kerr effect measuring apparatus was used to determine the thermal fluctuation resistance of the sample for determining magnetic properties. In addition, an X-ray diffraction apparatus and a transmission electron microscope were used to evaluate the structure of the obtained sample for observing texture (evaluation of the grain size and the like of the magnetic crystal grains).

Figure 3:
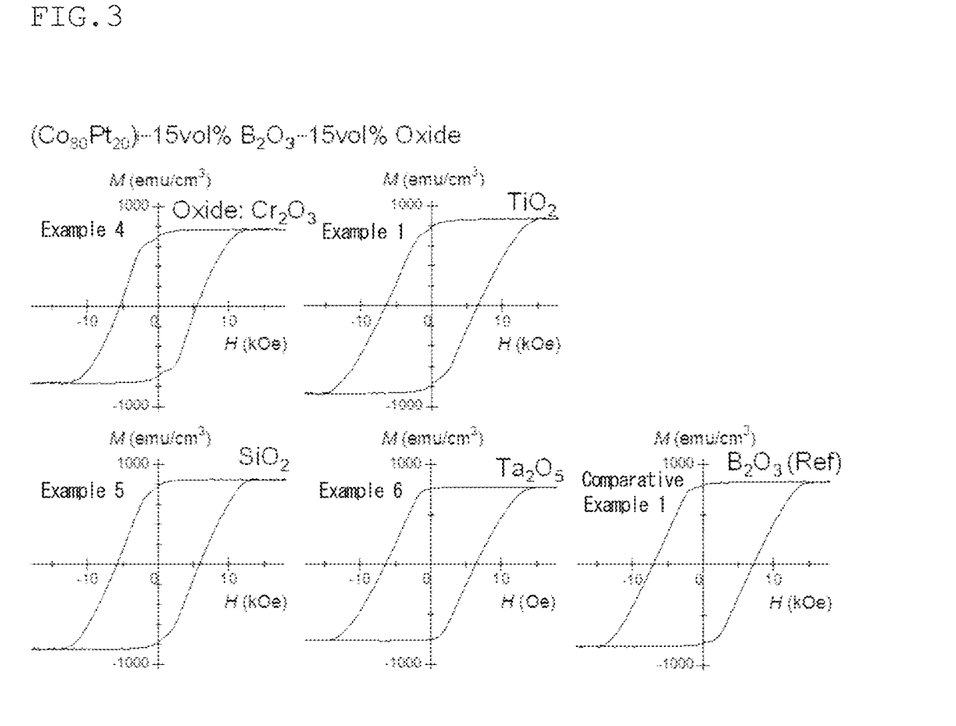
FIG. 3 is a graph showing examples of the granular medium magnetization curve of the samples for determining magnetic properties of Examples 1, 4 to 6, and Comparative example 1.

An example of the granular medium magnetization curve of the sample for determining magnetic properties of Example 1 is shown in FIG. 3 together with the results of other Examples and Comparative Examples. The horizontal axis of FIG. 3 represents the strength of the applied magnetic field, and the vertical axis of FIG. 3 represents the strength of magnetization per unit volume.

In addition, the saturation magnetization $M_s$, the coercive force $H_c$, and the inclination a at the point crossing the horizontal axis were obtained from the measured results of the granular medium magnetization curve of the sample for determining magnetic properties. The magnetocrystalline anisotropy constant $K_u$ was measured using a torque magnetometer. These values are shown in Table 1 together with the results of other Examples and Comparative Examples.

Figure 4:
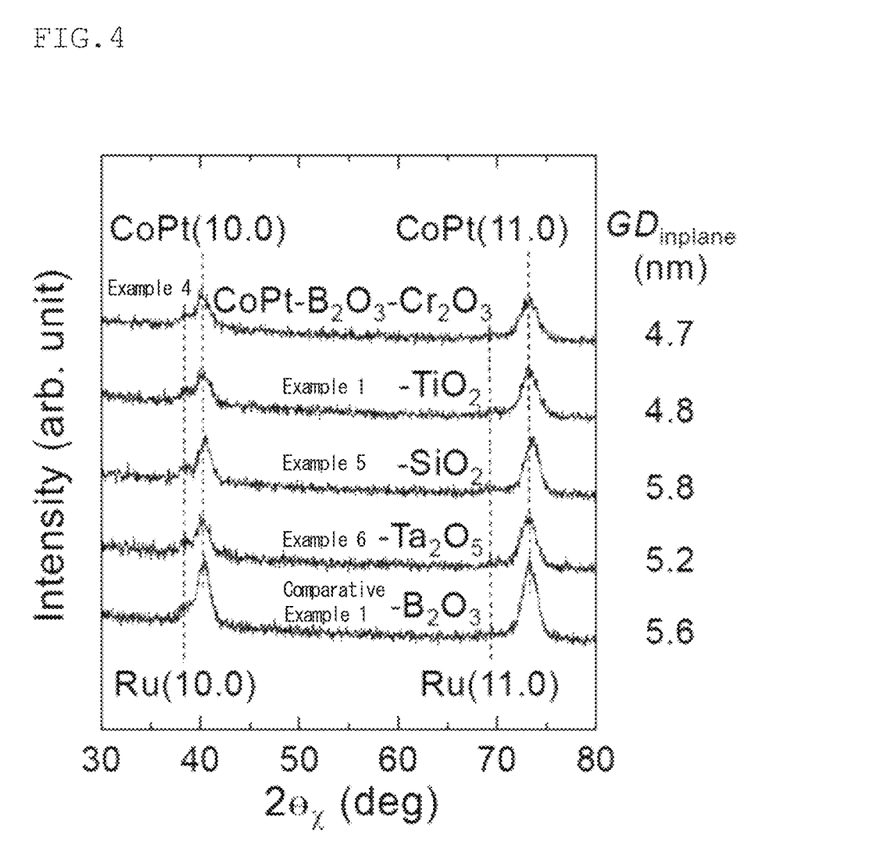
FIG. 4 is a graph showing the measured results of X-ray diffractometry in the in-plane direction (plane direction perpendicular to the height direction of the columnar CoPt alloy crystal grains) of the sample for determining magnetic properties of Examples 1, 4 to 6, and Comparative example 1.

FIG. 4 shows the measured results of X-ray diffractometry in the in-plane direction (plane direction perpendicular to the height direction of the columnar CoPt alloy crystal grains) of the sample for determining magnetic properties of Example 1 together with the results of other Examples and Comparative Examples. Among the measured results of the X-ray diffraction shown in FIG. 4, the Sherrer equation was applied to the measured result of the diffraction line of the hexagonal CoPt (11.0) to calculate the grain size $GD_{inplane}$ (nm) of the CoPt alloy crystal grains. The calculation results are shown in Table 1 together with the results of other Examples and Comparative Examples.

In addition, it was confirmed from the measured results of the X-ray diffractometry of Example 1 in the in-plane direction that all the CoPt alloy crystal grains were oriented in the C-plane.

In addition, the thermal fluctuation resistance was measured, and the magnetized regions inverted by thermal energies, that is, the grain size $GD_{act}$ of the magnetic crystal grains determined considering the interchange coupling between grains was determined. The measured results are shown in Table 1 together with the results of other Examples and Comparative Examples.

Figure 5:
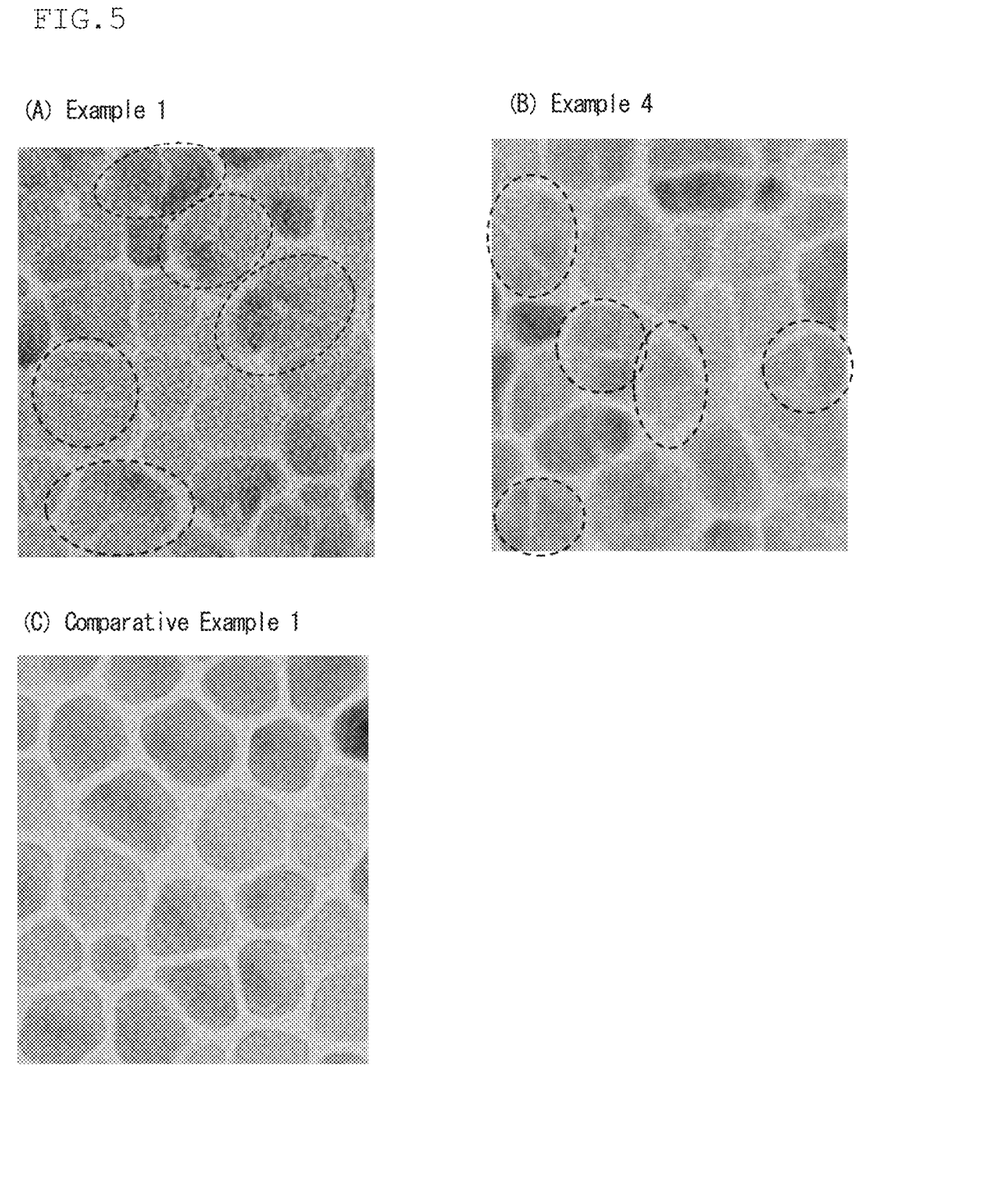
FIG. 5 includes plain TEM micrographs obtained by observing a sample for observing texture with a transmission electron microscope (TEM), showing (A) Example 1, (B) Example 4, and (C) Comparative Example 1.

In addition, the samples for observing texture were observed by a transmission electron microscopy (TEM) on a plane substantially perpendicular to the height direction of the columnar CoPt alloy crystal grains. The plane TEM micrographs of the observation results are shown in FIG. 5 together with the results of Example 4 and Comparative Example 1.

Further, in the plane TEM micrographs obtained, the diameter (circumference corresponding diameter) determined by specifying each CoPt crystal grain by image-processing and replacing the circumference thereof with a perfect circle was defined as $GD_{TEM}$. The centers of gravity of the respective particles were calculated by the image-processing, and the distance between the centers of gravity of adjacent particles was obtained as $GP_{TEM}$. The measured results are shown in Table 1 together with the results of other Examples and Comparative Examples.

In addition, thin grain boundaries were observed in some of the CoPt crystal grains, as can be seen from the plane TEM micrograph of this Example 1 that used $TiO_2$ as a high-melting-point oxide. As described above, this thin grain boundary is considered to be a high-melting-point oxide $TiO_2$ deposited prior to the deposition of the CoPt alloy. Note that, in FIG. 5(A), the CoPt crystal grains in which thin grain boundaries of $TiO_2$ were observed are surrounded by a dotted line.

Examples 2 to 27 and Comparative Examples 1 to 16

Samples for determining magnetic properties and samples for observing texture were prepared in the same manner as that in Example 1 except that the target composition was changed from that of Example 1, and evaluated in the same manner as in Example 1. The measured results are shown in Table 1 together with the target compositions. Concrete measured results for Examples 4 to 6 and Comparative Example 1 are also shown in FIGS. 3 and 4.

As can be seen from the plane TEM micrograph in FIG. 5(B) of Example 4 that used $Cr_2O_3$ as the high-melting-point oxide, thin grain boundaries were observed in some CoPt alloy crystal grains in Example 4 as in Example 1. In FIG. 5(B), the CoPt alloy crystal grains in which the thin grain boundaries of $Cr_2O_3$ were observed are surrounded by a dotted line.

Figure 6:
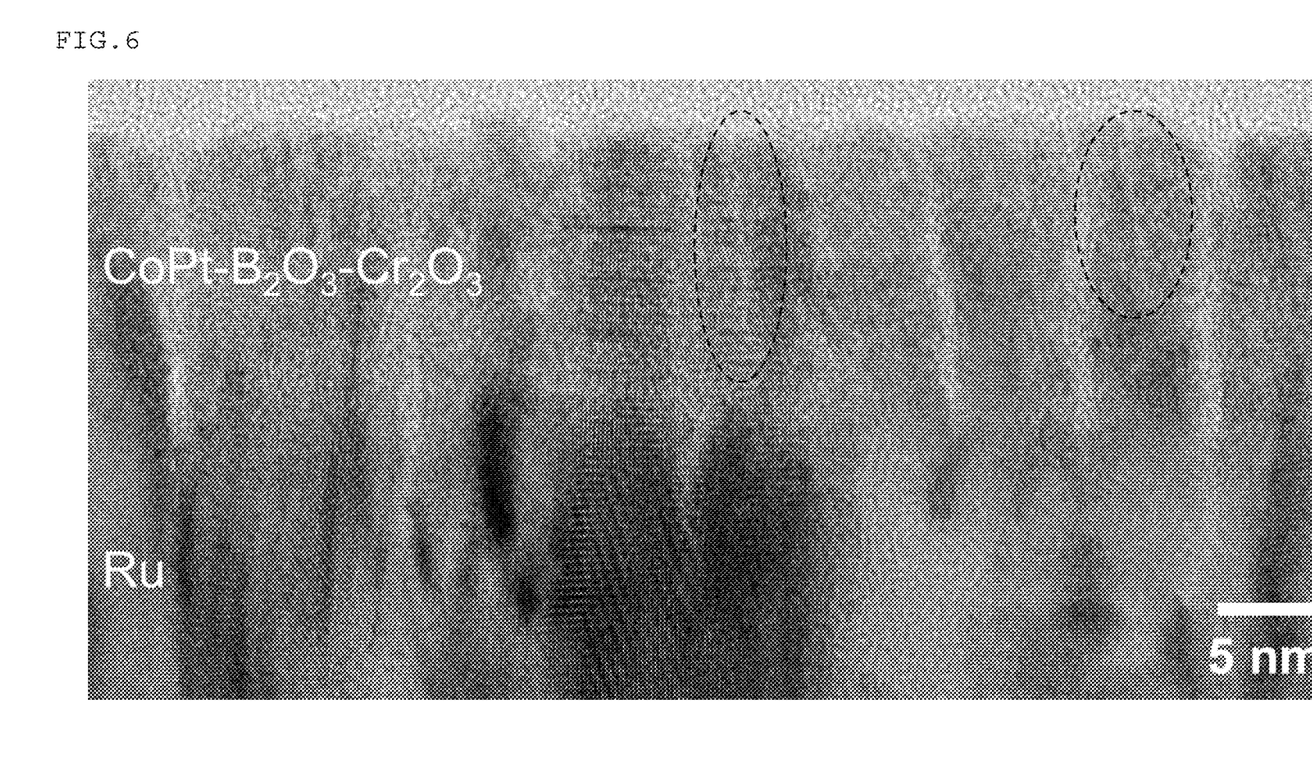
FIG. 6 is a cross-section TEM micrograph obtained by observing a sample for observing texture of Example 4 with a transmission electron microscope (TEM).

For the sample for observing texture of Example 4, a cut surface that was approximately parallel to the height direction of the columnar CoPt alloy crystal grains was observed by TEM. A cross-sectional TEM micrograph of the observation result is shown in FIG. 6. As shown in the cross-sectional TEM micrograph of FIG. 6, it is observed that a plurality of CoPt alloy crystal grains grow on one Ru crystal grain.

TABLE

| | Co at. % | Pt at. % | Cr at. % | First Oxide Composition | vol. % | Second Oxide Composition | vol. % | M.P. of Second Oxide (° C.) | First and Second Oxides Total vol. % |
|---|---|---|---|---|---|---|---|---|---|
| Comparative Example 1 | 80 | 20 | 0 | B2O3 | 30 | — | 0 | 450 | 30 |
| Comparative Example 2 | 80 | 20 | 0 | MoO3 | 30 | — | 0 | 795 | 30 |
| Comparative Example 3 | 80 | 20 | 0 | Ta2O5 | 30 | — | 0 | 1470 | 30 |
| Comparative Example 4 | 80 | 20 | 0 | SiO2 | 30 | — | 0 | 1600 | 30 |
| Comparative Example 5 | 80 | 20 | 0 | TiO2 | 30 | — | 0 | 1843 | 30 |
| Comparative Example 6 | 80 | 20 | 0 | Al2O3 | 30 | — | 0 | 2072 | 30 |
| Comparative Example 7 | 80 | 20 | 0 | Cr2O3 | 30 | — | 0 | 2435 | 30 |
| Comparative Example 8 | 80 | 20 | 0 | ZrO2 | 30 | — | 0 | 2700 | 30 |
| Comparative Example 9 | 80 | 20 | 0 | MgO | 30 | — | 0 | 2852 | 30 |
| Comparative Example 10 | 80 | 20 | 0 | B2O3 | 15 | MgO | 15 | 2852 | 30 |
| Comparative Example 11 | 80 | 20 | 0 | B2O3 | 15 | MoO3 | 15 | 795 | 30 |
| Comparative Example 12 | 80 | 20 | 0 | B2O3 | 21 | TiO2 | 21 | 1843 | 42 |
| Comparative Example 13 | 80 | 20 | 0 | B2O3 | 12 | TiO2 | 12 | 1843 | 24 |
| Comparative Example 14 | 92 | 8 | 0 | B2O3 | 15 | TiO2 | 15 | 1843 | 30 |
| Comparative Example 15 | 68 | 32 | 0 | B2O3 | 15 | TiO2 | 15 | 1843 | 30 |
| Comparative Example 16 | 68 | 20 | 12 | B2O3 | 15 | TiO2 | 15 | 1843 | 30 |
| Example 2 | 80 | 20 | 0 | B2O3 | 15 | ZrO2 | 15 | 2700 | 30 |
| Example 3 | 80 | 20 | 0 | B2O3 | 15 | Al2O3 | 15 | 2435 | 30 |
| Example 4 | 80 | 20 | 0 | B2O3 | 15 | Cr2O3 | 15 | 2435 | 30 |
| Example 1 | 80 | 20 | 0 | B2O3 | 15 | TiO2 | 15 | 1843 | 30 |
| Example 5 | 80 | 20 | 0 | B2O3 | 15 | SiO2 | 15 | 1600 | 30 |

TABLE-continued

| | | | | | | | | | |
|---|---|---|---|---|---|---|---|---|---|
| Example 6 | 80 | 20 | 0 | B2O3 | 15 | Ta2O5 | 15 | 1470 | 30 |
| Example 7 | 80 | 20 | 0 | B2O3 | 24 | ZrO2 | 6 | 2700 | 30 |
| Example 8 | 80 | 20 | 0 | B2O3 | 24 | Al2O3 | 6 | 2435 | 30 |
| Example 9 | 80 | 20 | 0 | B2O3 | 24 | Cr2O3 | 6 | 2435 | 30 |
| Example 10 | 80 | 20 | 0 | B2O3 | 24 | TiO2 | 6 | 1843 | 30 |
| Example 11 | 80 | 20 | 0 | B2O3 | 24 | SiO2 | 6 | 1600 | 30 |
| Example 12 | 80 | 20 | 0 | B2O3 | 24 | Ta2O5 | 6 | 1470 | 30 |
| Example 13 | 80 | 20 | 0 | B2O3 | 10 | ZrO2 | 20 | 2700 | 30 |
| Example 14 | 80 | 20 | 0 | B2O3 | 10 | Al2O3 | 20 | 2435 | 30 |
| Example 15 | 80 | 20 | 0 | B2O3 | 10 | Cr2O3 | 20 | 2435 | 30 |
| Example 16 | 80 | 20 | 0 | B2O3 | 10 | TiO2 | 20 | 1843 | 30 |
| Example 17 | 80 | 20 | 0 | B2O3 | 10 | SiO2 | 20 | 1600 | 30 |
| Example 18 | 80 | 20 | 0 | B2O3 | 10 | Ta2O5 | 20 | 1470 | 30 |
| Example 19 | 80 | 20 | 0 | B2O3 | 13 | TiO2 | 13 | 1843 | 26 |
| Example 20 | 80 | 20 | 0 | B2O3 | 18 | TiO2 | 18 | 1843 | 36 |
| Example 21 | 80 | 20 | 0 | B2O3 | 20 | TiO2 | 20 | 1843 | 40 |
| Example 22 | 70 | 20 | 10 | B2O3 | 15 | TiO2 | 15 | 1843 | 30 |
| Example 23 | 75 | 20 | 5 | B2O3 | 15 | TiO2 | 15 | 1843 | 30 |
| Example 24 | 70 | 30 | 0 | B2O3 | 15 | TiO2 | 15 | 1843 | 30 |
| Example 25 | 75 | 25 | 0 | B2O3 | 15 | TiO2 | 15 | 1843 | 30 |
| Example 26 | 85 | 15 | 0 | B2O3 | 15 | TiO2 | 15 | 1843 | 30 |
| Example 27 | 90 | 10 | 0 | B2O3 | 15 | TiO2 | 15 | 1843 | 30 |

| | Volume Ratio of First Oxide to Second Oxide | $K_u$ ($\times 10^6$ erg/cm$^3$) | $M_s$ (emu/cm$^3$) | $H_c$ (kOe) | $\alpha$ | $GD_{act}$ (nm) | $GD_{inplane}$ (nm) | $GD_{TEM}$ (nm) | $GP_{TEM}$ (nm) |
|---|---|---|---|---|---|---|---|---|---|
| Comparative Example 1 | — | 7.4 | 818 | 7.2 | 1.8 | 6.5 | 5.6 | 6.7 | 8.1 |
| Comparative Example 2 | — | 5.3 | 690 | 5.3 | 1.4 | 7.8 | 6.2 | 6.8 | 8.1 |
| Comparative Example 3 | — | 6.3 | 750 | 4.3 | 2.0 | 7.7 | 6.3 | 6.9 | 8.1 |
| Comparative Example 4 | — | 5.9 | 746 | 4.6 | 2.1 | 7.9 | 6.4 | 6.8 | 8.1 |
| Comparative Example 5 | — | 5.8 | 734 | 5.9 | 1.6 | 6.4 | 5.5 | 6.7 | 8.1 |
| Comparative Example 6 | — | 3.6 | 615 | 0.7 | 2.8 | 11.6 | 11.0 | 7.3 | 8.3 |
| Comparative Example 7 | — | 3.8 | 611 | 1.6 | 4.0 | 11.5 | 10.6 | 7.5 | 8.5 |
| Comparative Example 8 | — | 4.8 | 725 | 1.0 | 5.0 | 11.5 | 10.7 | 7.6 | 8.5 |
| Comparative Example 9 | — | 4.3 | 640 | 1.1 | 5.5 | 11.9 | 10.9 | 7.7 | 8.6 |
| Comparative Example 10 | 1 | 3.9 | 620 | 3.6 | 2.7 | 8.5 | 5.3 | 7.1 | 8.3 |
| Comparative Example 11 | 1 | 5.2 | 695 | 5.3 | 1.5 | 7.0 | 5.4 | 7.2 | 8.1 |
| Comparative Example 12 | 1 | 6.2 | 710 | 5.2 | 2.0 | 6.7 | 5.2 | 6.5 | 7.4 |
| Comparative Example 13 | 1 | 7.2 | 840 | 6.7 | 1.9 | 7.0 | 5.6 | 6.9 | 7.9 |
| Comparative Example 14 | 1 | 5.5 | 889 | 4.1 | 2.1 | 6.8 | 5.4 | 6.5 | 7.7 |
| Comparative Example 15 | 1 | 6.1 | 727 | 4.3 | 2.2 | 7.1 | 5.7 | 6.5 | 7.7 |
| Comparative Example 16 | 1 | 5.9 | 702 | 5.1 | 1.4 | 6.9 | 5.2 | 6.6 | 7.8 |
| Example 2 | 1 | 4.9 | 689 | 5.0 | 2.5 | 8.1 | 4.6 | 6.7 | 8.2 |
| Example 3 | 1 | 5.7 | 705 | 5.3 | 2.4 | 7.9 | 4.5 | 6.8 | 8.0 |
| Example 4 | 1 | 6.5 | 733 | 5.9 | 2.2 | 7.6 | 4.7 | 6.7 | 7.9 |
| Example 1 | 1 | 7.7 | 806 | 7.1 | 1.8 | 6.6 | 4.8 | 6.5 | 7.7 |
| Example 5 | 1 | 7.3 | 795 | 6.2 | 2.0 | 7.3 | 5.8 | 6.7 | 7.8 |
| Example 6 | 1 | 6.5 | 765 | 6.5 | 1.8 | 7.9 | 5.2 | 6.9 | 8.1 |
| Example 7 | 4 | 7.4 | 823 | 6.8 | 1.9 | 7.6 | 4.8 | 6.7 | 8.1 |
| Example 8 | 4 | 6.6 | 774 | 6.2 | 1.9 | 7.4 | 4.9 | 6.7 | 7.9 |
| Example 9 | 4 | 7.4 | 814 | 7.1 | 1.6 | 7.2 | 4.8 | 6.7 | 7.9 |
| Example 10 | 4 | 7.6 | 819 | 7.3 | 1.7 | 6.4 | 4.7 | 6.7 | 7.9 |
| Example 11 | 4 | 7.4 | 812 | 6.7 | 1.9 | 7.6 | 5.7 | 6.8 | 7.7 |
| Example 12 | 4 | 6.9 | 795 | 6.9 | 1.6 | 8.1 | 5.4 | 6.7 | 7.8 |
| Example 13 | 0.5 | 4.6 | 675 | 3.9 | 3.1 | 8.3 | 4.5 | 6.7 | 7.9 |
| Example 14 | 0.5 | 5.4 | 697 | 4.6 | 2.8 | 8.0 | 4.3 | 6.7 | 8.0 |
| Example 15 | 0.5 | 6.2 | 715 | 5.1 | 2.4 | 7.8 | 4.2 | 6.7 | 8.0 |
| Example 16 | 0.5 | 7.2 | 795 | 6.4 | 2.1 | 6.8 | 4.3 | 6.7 | 8.0 |
| Example 17 | 0.5 | 6.9 | 776 | 5.5 | 2.2 | 7.4 | 4.6 | 6.7 | 7.9 |
| Example 18 | 0.5 | 6.1 | 751 | 5.7 | 2.0 | 7.8 | 4.7 | 6.7 | 7.9 |
| Example 19 | 1 | 8.1 | 835 | 7.4 | 1.9 | 6.8 | 4.9 | 6.8 | 7.9 |
| Example 20 | 1 | 7.4 | 770 | 6.7 | 1.6 | 6.4 | 4.6 | 6.6 | 7.6 |
| Example 21 | 1 | 7.0 | 739 | 6.2 | 1.5 | 6.2 | 4.4 | 6.5 | 7.5 |
| Example 22 | 1 | 7.2 | 771 | 7.6 | 1.6 | 6.3 | 4.3 | 6.7 | 7.8 |
| Example 23 | 1 | 7.5 | 790 | 7.3 | 1.7 | 6.4 | 4.6 | 6.6 | 7.7 |
| Example 24 | 1 | 7.5 | 801 | 7.1 | 1.9 | 6.6 | 4.8 | 6.6 | 7.7 |
| Example 25 | 1 | 7.8 | 815 | 7.3 | 1.8 | 6.7 | 4.7 | 6.6 | 7.7 |
| Example 26 | 1 | 7.4 | 830 | 7.0 | 1.9 | 6.7 | 4.7 | 6.6 | 7.7 |
| Example 27 | 1 | 7.1 | 871 | 6.5 | 1.9 | 6.5 | 4.7 | 6.6 | 7.7 |

As is clear from Table 1, in Examples 1 to 27 which are within the scope of the present invention, the magnetic thin films in which the micronization of magnetic crystal grains and the reduction of the distance between centers of magnetic crystal grains were achieved were obtained, and the magnetic thin films obtained in Examples 1 to 27 exhibit good magnetic properties.

On the other hand, in Comparative Examples 1 to 16 which are not within the scope of the present invention, any magnetic thin film was not obtained in which the micronization of the magnetic crystal grains, the reduction of the distance between the centers of the magnetic crystal grains, and the expression of good magnetic properties were simultaneously achieved.

Here, from the viewpoint of being a good magnetic thin film, the magnetocrystalline anisotropy constant $K_u$ and $GD_{inplane}$ are preferably $K_u > 4.6 \times 10^6$ erg/cm$^3$ and $GD_{inplane} < 5.1$ nm, and more preferably $K_u > 6.0 \times 10^6$ erg/cm$^3$ and $GD_{inplane} < 4.8$ nm. Most of the magnetic thin films obtained in Examples 1 to 27 satisfy the preferable conditions ($K_u > 4.6 \times 10^6$ erg/cm$^3$ and $GD_{inplane} < 5.1$ nm), and some of the magnetic thin films obtained in Examples 1 to 27 also satisfy the more preferable conditions ($K_u > 6.0 \times 10^6$ erg/cm$^3$ and $GD_{inplane} < 4.8$ nm).

It should be noted that the above-mentioned preferable conditions ($K_u > 4.6 \times 10^6$ erg/cm$^3$ and $GD_{inplane} < 5.1$ nm) and the above-mentioned more preferable conditions ($K_u > 6.0 \times 10^6$ erg/cm$^3$ and $GD_{inplane} < 4.8$ nm) are criteria for judging that the thin film is a good magnetic thin film, and it does not mean that a sample that does not satisfy these conditions straightforwardly falls outside the scope of the present invention.

For example, the values of $GD_{inplane}$ of Examples 5 and 11 that used SiO$_2$ as the second oxide were 5.8 nm and 5.7 nm, respectively, and the condition for $GD_{inplane}$ among the above-mentioned preferable conditions ($K_u > 4.6 \times 10^6$ erg/cm$^3$ and $GD_{inplane} < 5.1$ nm) and the condition for $GD_{inplane}$ among the above-mentioned more preferable conditions ($K_u > 6.0 \times 10^6$ erg/cm$^3$ and $GD_{inplane} < 4.8$ nm) were not satisfied. However, the values were smaller than $GD_{inplane}$ (6.4 nm) of Comparative Example 4 that used only SiO$_2$ as the oxide, and thus the effects of the present invention were exhibited. $K_u$'s of Examples 5 and 11 were $7.3 \times 10^6$ erg/cm$^3$ and $7.4 \times 10^6$ erg/cm$^3$, respectively, which were larger than $K_u$ ($5.9 \times 10^6$ erg/cm$^3$) of Comparative Example 4 that used only SiO$_2$ as the oxide.

The values of $GD_{inplane}$ of Examples 6 and 12 that used Ta$_2$O$_5$ as the second oxide were 5.2 nm and 5.4 nm, respectively, and the condition for $GD_{inplane}$ among the above-mentioned preferable conditions ($K_u > 4.6 \times 10^6$ erg/cm$^3$ and $GD_{inplane} < 5 0.1$ nm) and the condition for $GD_{inplane}$ among the above-mentioned more preferable conditions ($K_u > 6.0 \times 10^6$ erg/cm$^3$ and $GD_{inplane} < 4.8$ nm) were not satisfied. However, the values were smaller than $GD_{inplane}$ (6.3 nm) of Comparative Example 3 that used only Ta$_2$O$_5$ as the oxide, and the effects of the present invention were exhibited. In addition, $K_u$'s of Examples 6 and 12 were $6.5 \times 10^6$ erg/cm$^3$ and $6.9 \times 10^6$ erg/cm$^3$, respectively, which were larger than $K_u$ of Comparative Example 3 ($6.3 \times 10^6$ erg/cm$^3$) that used only Ta$_2$O$_5$ as the oxide.

Further, $K_u$ of Example 13 that used ZrO$_2$ as the second oxide was $4.6 \times 10^6$ erg/cm$^3$ and the condition for $K_u$ among the above-mentioned preferable conditions ($K_u > 4.6 \times 10^6$ erg/cm$^3$ and $GD_{inplane} < 5.1$ nm) and the condition for $K_u$ among the above-mentioned more preferable conditions ($K_u > 6.0 \times 10^6$ erg/cm$^3$ and $GD_{inplane} < 4.8$ nm) were not satisfied. However, $GD_{inplane}$ of Example 13 was 4.5 nm, which was remarkably smaller than $GD_{inplane}$ (10.7 nm) of Comparative Example 8 that used only ZrO$_2$ as the oxide, and the effects of the present invention were exhibited.

INDUSTRIAL APPLICABILITY

The sputtering target for magnetic recording media according to the present invention is capable of producing a magnetic thin film in which magnetic crystal grains are micronized and the distance between the centers of the magnetic crystal grains is reduced while good magnetic properties are maintained, and has industrial applicability.

REFERENCE SIGNS LIST 10,20,30,40 granular medium
12 Ru underlayer
14 high-melting-point oxide
16,22,32,42 CoPt alloy crystal grain
18 B$_2$O$_3$
18A B$_2$O$_3$ which has been deposited to become a solid
18B liquid-state B$_2$O$_3$

The invention claimed is:

1. A sputtering target for magnetic recording media comprising metallic Pt and an oxide, with the balance being metallic Co and inevitable impurities, wherein
   the metallic Co is contained in a range of 70 at % or more and 90 at % or less and the metallic Pt is contained in a range of 10 at % or more and 30 at % or less relative to a total of metallic components in the sputtering target for magnetic recording media,
   the oxide is contained in a range of 26 vol % or more and 40 vol % or less relative to a total volume of the sputtering target for magnetic recording media, and
   the oxide is composed of B$_2$O$_3$ and one or more high-melting-point oxides having a melting point of 1470° C. or higher and 2800° C. or lower.

2. A sputtering target for magnetic recording media comprising metallic Pt, metallic Cr, and an oxide, with the balance being metallic Co and inevitable impurities, wherein
   the metallic Co is contained in a range of 70 at % or more and less than 90 at %, the metallic Pt is contained in a range of 10 at % or more and less than 30 at %, and the metallic Cr is contained in a range of more than 0 at % and 10 at % or less, relative to a total of metallic components in the sputtering target for magnetic recording media,
   the oxide is contained in a range of 26 vol % or more and 40 vol % or less relative to a total volume of the sputtering target for magnetic recording media, and
   the oxide is composed of B$_2$O$_3$ and one or more high-melting-point oxides having a melting point of 1470° C. or higher and 2800° C. or lower.

3. The sputtering target for magnetic recording media according to claim 1, wherein a volume ratio of B$_2$O$_3$ relative to a total of the one or more high-melting-point oxides is 0.5 or more and 4 or less.

4. The sputtering target for magnetic recording media according to claim 1, wherein the one or more high-melting-point oxides are selected from the group consisting of TiO$_2$, SiO$_2$, Ta$_2$O$_5$, Cr$_2$O$_3$, Al$_2$O$_3$, and ZrO$_2$.

5. The sputtering target for magnetic recording media according to claim 4, wherein the one or more high-melting-point oxides are TiO$_2$.

6. The sputtering target for magnetic recording media according to claim 2, wherein a volume ratio of B$_2$O$_3$ relative to a total of the one or more high-melting-point oxides is 0.5 or more and 4 or less.

7. The sputtering target for magnetic recording media according to claim 2, wherein the one or more high-melting-point oxides are selected from the group consisting of $TiO_2$, $SiO_2$, $Ta_2O_5$, $Cr_2O_3$, $Al_2O_3$, and $ZrO_2$.

8. The sputtering target for magnetic recording media according to claim 3, wherein the one or more high-melting-point oxides are selected from the group consisting of $TiO_2$, $SiO_2$, $Ta_2O_5$, $Cr_2O_3$, $Al_2O_3$, and $ZrO_2$.

9. The sputtering target for magnetic recording media according to claim 6, wherein the one or more high-melting-point oxides are selected from the group consisting of $TiO_2$, $SiO_2$, $Ta_2O_5$, $Cr_2O_3$, $Al_2O_3$, and $ZrO_2$.

10. The sputtering target for magnetic recording media according to claim 7, wherein the one or more high-melting-point oxides are $TiO_2$.

11. The sputtering target for magnetic recording media according to claim 8, wherein the one or more high-melting-point oxides are $TiO_2$.

12. The sputtering target for magnetic recording media according to claim 9, wherein the one or more high-melting-point oxides are $TiO_2$.

13. The sputtering target for magnetic recording media according to claim 1, wherein the oxide is contained in a range of 26 vol % or more and 36 vol % or less relative to the total volume of the sputtering target for magnetic recording media.

14. The sputtering target for magnetic recording media according to claim 1, wherein the metallic Pt is contained in a range of 15 at % or more and 30 at % or less relative to the total of metallic components in the sputtering target for magnetic recording media.

15. The sputtering target for magnetic recording media according to claim 1, wherein the metallic Co is contained in a range of 75 at % or more and 90 at % or less relative to the total of metallic components in the sputtering target for magnetic recording media.

16. The sputtering target for magnetic recording media according to claim 1, wherein a volume ratio of $B_2O_3$ relative to a total of the one or more high-melting-point oxides is 0.5 or more and 1 or less.

17. The sputtering target for magnetic recording media according to claim 1, wherein:
the oxide is contained in a range of 26 vol % or more and 36 vol % or less relative to the total volume of the sputtering target for magnetic recording media,
the metallic Pt is contained in a range of 15 at % or more and 30 at % or less relative to the total of metallic components in the sputtering target for magnetic recording media, and
the metallic Co is contained in a range of 75 at % or more and 90 at % or less relative to the total of metallic components in the sputtering target for magnetic recording media.

18. The sputtering target for magnetic recording media according to claim 17, wherein a volume ratio of $B_2O_3$ relative to a total of the one or more high-melting-point oxides is 0.5 or more and 1 or less.

19. The sputtering target for magnetic recording media according to claim 1, wherein the sputtering target does not contain Cr.

20. The sputtering target for magnetic recording media according to claim 1, wherein the one or more high-melting-point oxides are selected from the group consisting of $TiO_2$, $Cr_2O_3$, $Al_2O_3$, and $ZrO_2$.

* * * * *